(12) United States Patent
Martinez

(10) Patent No.: US 7,216,262 B2
(45) Date of Patent: May 8, 2007

(54) RAM DIAGNOSTIC READ CIRCUIT PROVIDING EXTERNAL INTEGRATED CIRCUIT RAM FAILURE DIAGNOSIS AND METHOD

(75) Inventor: Antonio Marroig Martinez, Los Altos, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 528 days.

(21) Appl. No.: 10/678,688

(22) Filed: Oct. 3, 2003

(65) Prior Publication Data

US 2005/0076268 A1 Apr. 7, 2005

(51) Int. Cl.
*G06F 11/00* (2006.01)
(52) U.S. Cl. ....................................... 714/42
(58) Field of Classification Search .................. 714/42, 714/31, 32, 726, 45
See application file for complete search history.

(56) References Cited

U.S. PATENT DOCUMENTS

| | | | | |
|---|---|---|---|---|
| 5,383,195 A | * | 1/1995 | Spence et al. | 714/733 |
| 5,617,531 A | * | 4/1997 | Crouch et al. | 714/30 |
| 5,828,825 A | * | 10/1998 | Eskandari et al. | 714/27 |
| 6,085,346 A | * | 7/2000 | Lepejian et al. | 714/733 |
| 6,769,081 B1 | * | 7/2004 | Parulkar | 714/733 |
| 6,907,555 B1 | * | 6/2005 | Nomura et al. | 714/719 |
| 2002/0184582 A1 | * | 12/2002 | Pouya et al. | 714/726 |
| 2003/0233604 A1 | * | 12/2003 | Lin et al. | 714/718 |

* cited by examiner

*Primary Examiner*—Nadeem Iqbal

(57) ABSTRACT

A diagnostic read circuit provides RAM data for external analysis. The RAM or RAMs and diagnostic read circuit are integrated within an integrated circuit. If a data storage error occurs, the diagnostic read circuit provides the RAM data for external analysis. The diagnostic read circuit includes an address generator that generates RAM addresses for data retrieval and a data register that temporarily stores the retrieved data and provides the data to at least one external pin for analysis. The RAM address may also be provided with the data.

19 Claims, 3 Drawing Sheets

RAM DIAGNOSTIC READ CIRCUIT PROVIDING EXTERNAL INTEGRATED CIRCUIT RAM FAILURE DIAGNOSIS AND METHOD

BACKGROUND OF THE INVENTION

Integrated circuits include many imbedded random access memories (RAMs) of many different sizes and offering different options (single, dual, multi-port). These RAMs sometimes fail in the field, even after passing manufacturing tests. For example, integrated circuits may include multiple RAMs used to buffer data flow. Failures may occur in such RAMs for both inbound and outbound data flow. The failures may occur intermittently depending on data pattern and voltages. Once failure occurs, it is difficult to determined the contents of the failing RAMs because the RAMs are imbedded within the integrated circuit. Failing bits and addresses thus must be inferred by examining actual data flow and working backwards to determine what would reasonably have been expected to have gone through the failing RAM. However, many uncertainties can be left in this type of analysis. Furthermore, this form of analysis consumes an inordinate amount of time.

When RAMs fail in the field, there are no readily available options to diagnose the failures as they occur. The imbedded RAMs are usually tested by imbedded built-in self-test (BIST) circuits which are small logic blocks that run a variety of tests (checkerboard, walking ones/zeros, etc.). Sometimes, the RAMs are tested through external testers, although this is not as effective due to lower pattern coverage and slower speed resulting in longer test durations. However, once in the field, a failure cannot be diagnosed through an external tester. Further, a BIST is limited in its ability to detect or diagnose failures. While a BIST may detect most failures during manufacturing, no BIST will have tests comprehensive enough to detect all possible failure modes. The reason for this is that a field failure mode will often be undetectable by BIST algorithms.

An example is when a RAM, imbedded in an integrated circuit, experiences a parity error in a data stream. It is often quite difficult to disengage the RAM from the data flow to determine exactly what section or portion of the RAM failed. BIST blocks only go through a predetermined sequence of write and read commands to test RAMs with specific data patterns. A BIST block cannot easily read the exact content of a failing RAM without going through its predetermined sequence.

Hence, there is a need in the art for a means by which RAM failures may be readily diagnosed immediately after failure occurs, even while the integrated circuit is engaged in processing data flows in the field. One or more embodiments of the present invention address such needs.

SUMMARY

In accordance with one embodiment of the present invention, a diagnostic read circuit transfers the content of any RAM imbedded in an integrated circuit and delivers the entire contents external to the integrated circuit for examination. Data can be delivered through a scan chain, dedicated external pins or internal buses that then go through external pins. The diagnostic read circuit can share any number of pins to be enabled and to deliver data externally. The diagnostic read circuit may include an address generator to ensure all RAM data contents are read, a data register for temporarily storing RAM data contents until ready to be delivered externally, and a sequence controller to initiate and control a RAM diagnostic read.

In accordance with further embodiments of the present invention, an integrated circuit comprises a random access memory, and a diagnostic read circuit, either stand alone or imbedded in a built-in self-test circuit, that reads memory storage errors in the random access memory and provides random access memory data contents externally when a memory storage error is detected in the random access memory.

In accordance with another embodiment of the present invention, the diagnostic read circuit may be imbedded in a BIST and share the address generator and data register.

The data register may be coupled to an external pin or pins of the integrated circuit. Alternatively, the integrated circuit may include a scan chain coupling the data register to an external pin. Alternatively, the data register may be coupled to an external, already defined bus in the integrated circuit.

In accordance with other embodiments of the invention, an address generator provides data storage addresses to the random access memory for the fetching of the stored data. The fetched data and the data storage addresses are provided from the integrated circuit for external analysis responsive to a detected error in data storage. The data storage addresses may be transferred external to the integrated circuit through, for example, a scan chain, external pin or pins, or an external bus.

In accordance with a further embodiment of the present invention, an integrated circuit, performs a method to allow a read of a RAM at any time and to provide the read memory contents for external analysis.

BRIEF DESCRIPTION OF THE DRAWINGS

The foregoing aspects and many of the attended advantages of this invention will become more readily appreciated as the same become better understood by reference to the following non-limiting detailed description, when taken in conjunction with the accompanying drawings, wherein.

DETAILED DESCRIPTION

The following discussion is presented to enable a person skilled in the art to make and use the invention. The general principles described herein may be applied to embodiments and applications other than those detailed below without departing from the spirit and scope of the present invention. The present invention is not intended to be limited to the embodiments shown, but is to be accorded the widest scope consistent with the principles and features disclosed or suggested herein.

Figure 1:
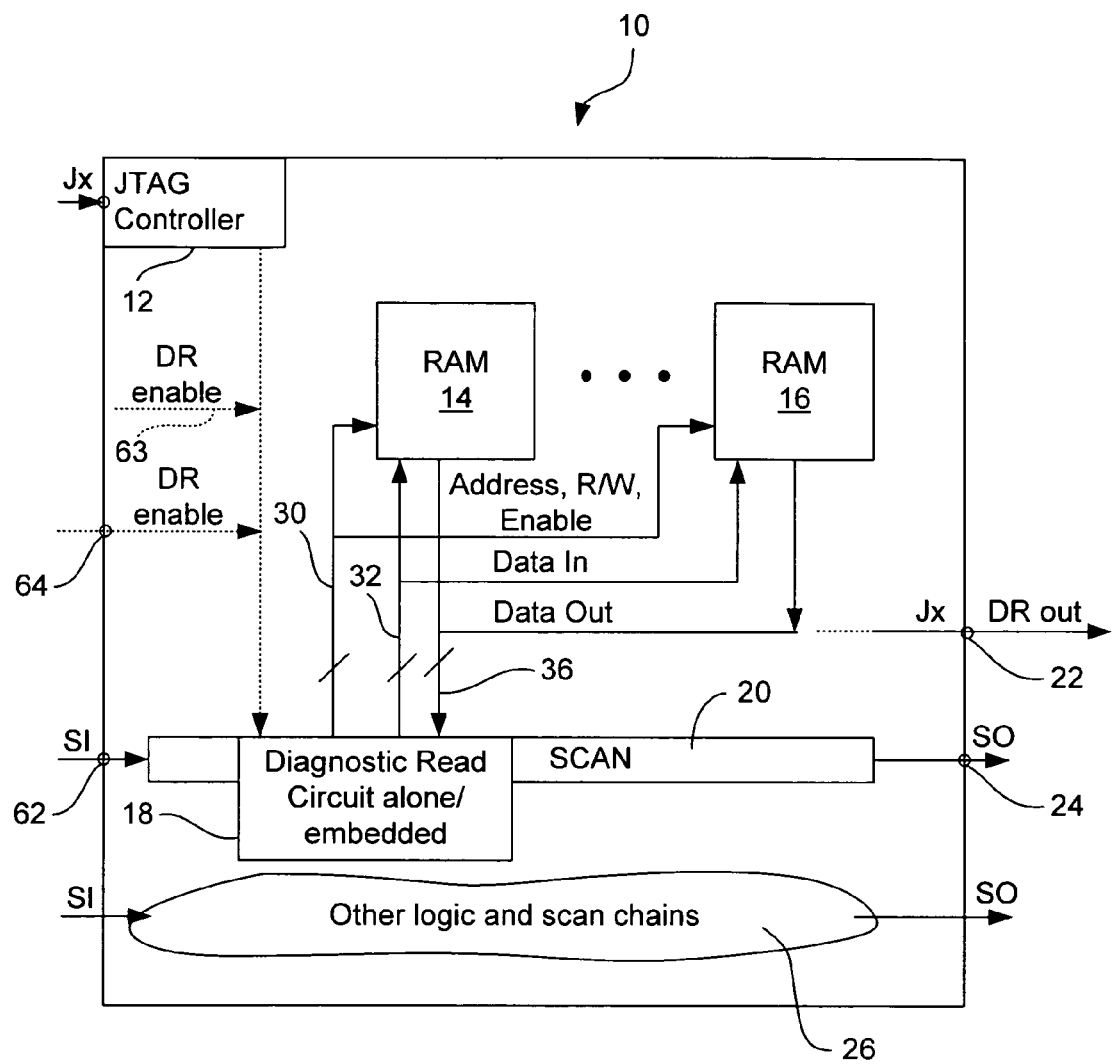
FIG. 1 is a block diagram of an integrated circuit including a diagnostic read circuit which may be by itself or embedded in a BIST circuit embodying the present invention embedded with a scan chain and a plurality of random access memories to be tested by the BIST.

FIG. 1 shows an integrated circuit 10 embodying the present invention. The integrated circuit includes a JTAG controller 12, a plurality of random access memories (RAMs) 14 and 16 to be tested, and a diagnostic read circuit 18 by itself or embedded in a BIST circuit embodying the present invention and which is embedded in a scan chain 20. The integrated circuit further includes various means to access the diagnostic read circuit or BIST 18 including, for example, a DR enable external pin 64 for receiving an externally generated DR enable signal, an internally generated DR enable signal 63, or the JTAG controller 12. The integrated circuit further includes a scan chain input pin 62, Jx, DR output external pin 22, and a scan chain output external pin 24. As may be appreciated by those skilled in the art, the Jx, DR pin 22 may comprise a plurality of external pins. In addition to the foregoing, the integrated circuit 10 may include other logic and scan chains as generally represented at 26.

Figure 2:
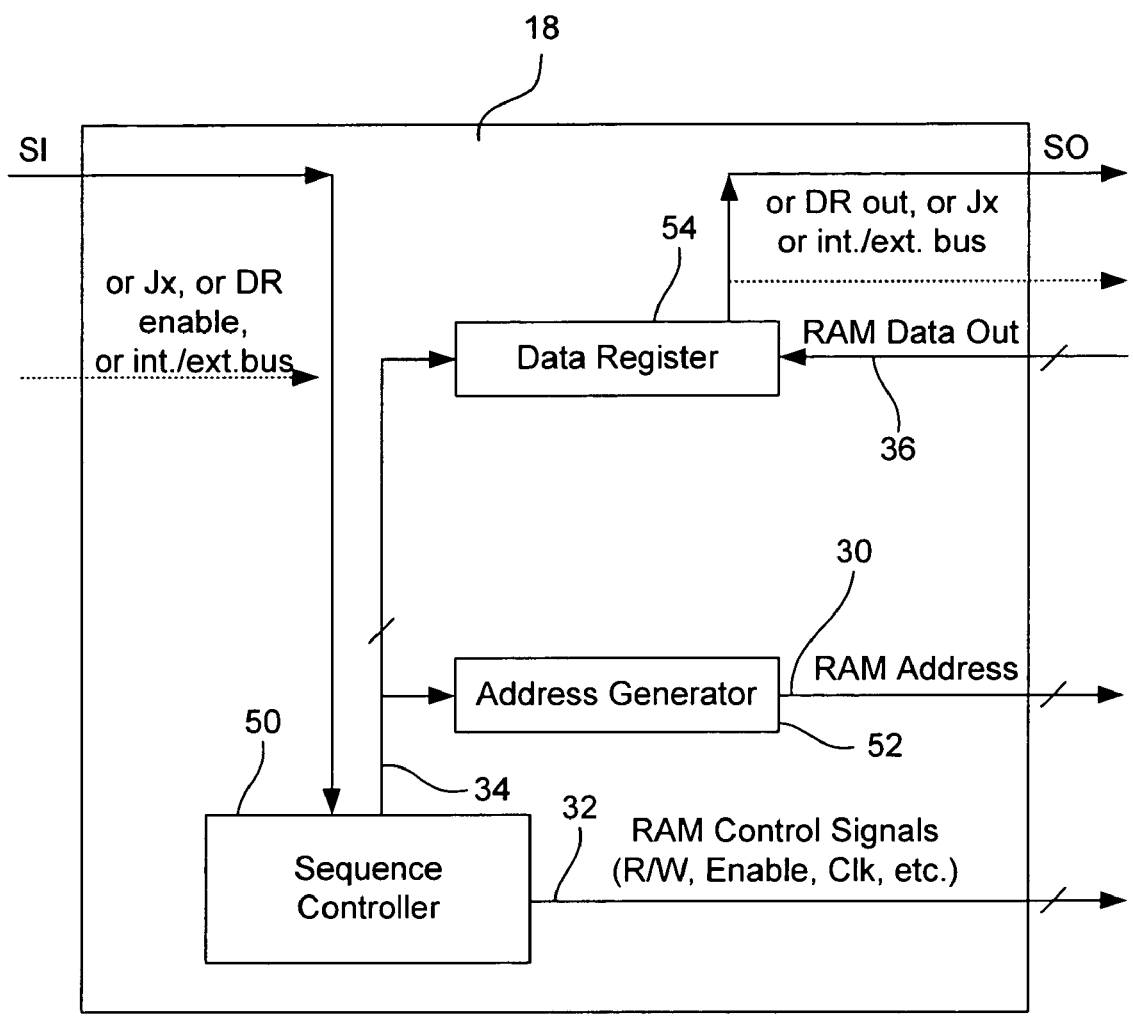
FIG. 2 is a block diagram of the diagnostic read circuit of FIG. 1 embodying the present invention.

FIG. 2 shows one diagnostic read circuit embodiment of the invention. The diagnostic read circuit 18 generally includes a sequence controller 50, an address generator 52, and a data register 54.

As will be noted in FIG. 1 and FIG. 2, the address generator 52 of the diagnostic read circuit 18 provides retrieval addresses to the RAMs 14 and 16 over address bus 30. The sequence controller 50 provides control signals to the RAMs 14 and 16 over bus 32. The sequence controller also, as will be noted in FIG. 2, provides control signals to the address generator 52, and the data register 54 over bus 34. The address generator 52 generates the data storage and retrieval addresses which are conveyed to the RAMs 14 and 16. The data register 54 receives data read from the RAMs 14 and 16 over a bus 36.

When a data storage error of a RAM is detected, the diagnostic read circuit is invoked. This may occur by a control signal received from the JTAG controller 12, by a DR enable signal 63, or other control signal provided at pin 64. The sequence controller 50 then causes the address generator 52 to generate all of the addresses of the RAMS 14 thru 16. The RAMS are preferably addressed in parallel to conserve time. The fetched or retrieved data of the RAM 14 thru 16, as the RAMS are addressed, is conveyed to the data register 54. For each word of data retrieved from the RAMS 14 thru 16, the sequence controller 50 will then cause the data register to output the retrieved data to external pin 22 (or external pins) to present the data for external analysis. Alternatively, the data register may provide the retrieved data to the scan chain 20 for outputting at pin 24.

Along with the retrieved data, the diagnostic read circuit 18 may also provide the RAM addresses used during the data retrieval. The address may also be provided to the external pin 24 through the scan chain 20.

Figure 3:
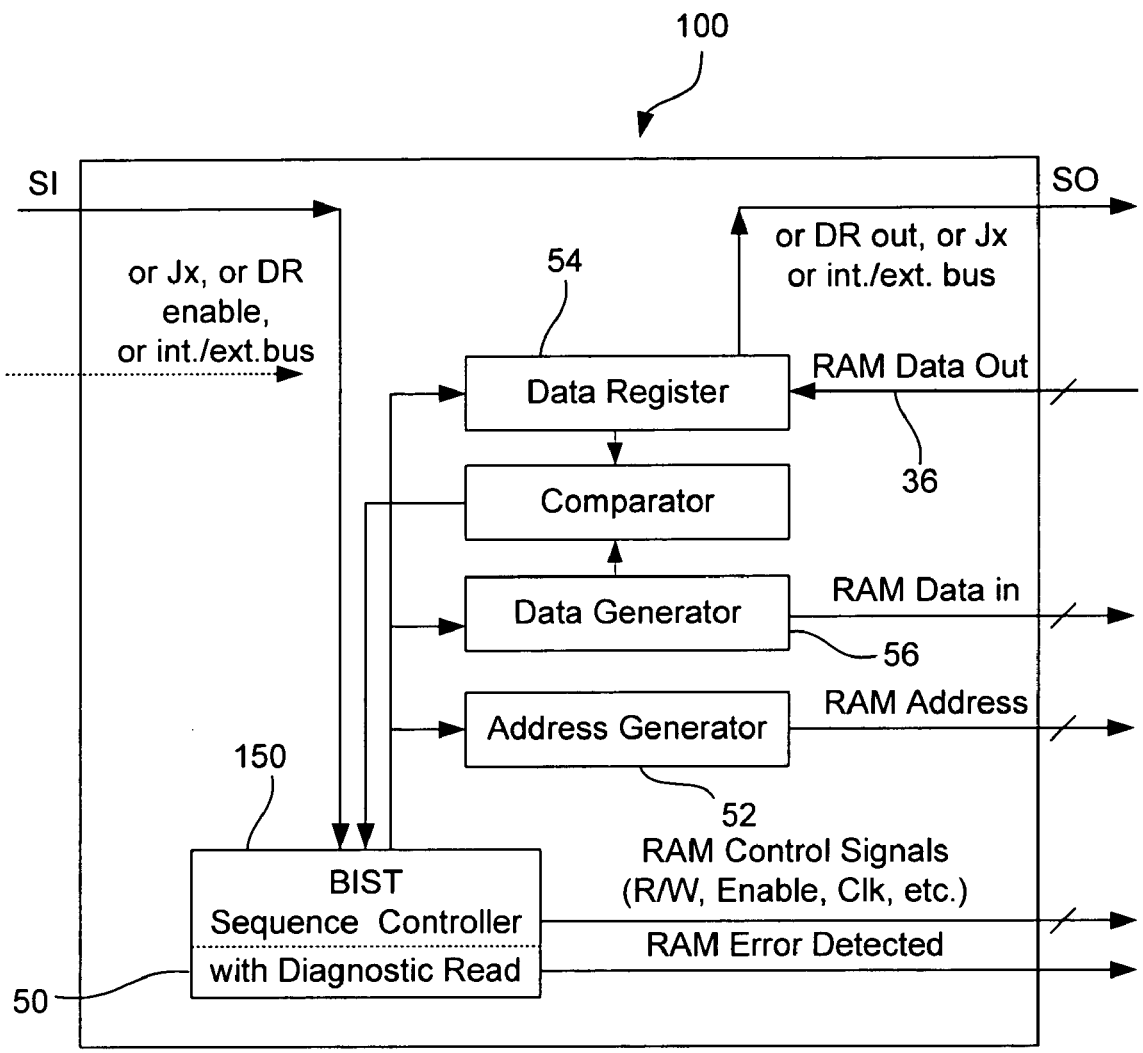
FIG. 3 is a block diagram of the BIST circuit of FIG. 1 embodying the present invention.

FIG. 3 shows a diagnostic read circuit imbedded in a BIST circuit 100. The BIST circuit 100 and the diagnostic read circuit have address generator 52 and data register 54 in common. The diagnostic read sequence controller 50 is imbedded in the BIST sequence controller 150.

As will be noted in FIG. 1 and FIG. 3, the BIST circuit 100 may provide read and write data storage and retrieval addresses to the RAMs 14 thru 16 over address bus 30. In addition, the BIST 18 may provide preset data to the RAMs 14 thru 16 over data input bus 32 and reads data from the RAMs 14 thru 16 over data bus 36. As will be noted in FIG. 3, the BIST circuit 18 also includes the BIST sequence controller 150, a data generator 56, and a comparator 58.

The address generator 52 generates the data storage and retrieval addresses which are conveyed to the RAMs 14 thru 16. The data generator 56 generates preset data which is written into the RAMs 14 thru 16 during a BIST test of the RAMs 14 thru 16. The data register 54 receives data read from the RAMs 14 thru 16. The comparator 58 detects errors in the RAM data storage. More specifically, the comparator compares the data in the data generator 56, which is the preset data written into the RAMs 14 thru 16, to the data read from the RAMs 14 thru 16 contained within the data register 54 to detect data storage errors in RAMs 14 thru 16.

In accordance with this embodiment of the present invention, a BIST test of RAMs 14 thru 16 may be enabled first by the issuance of a direct command to the BIST circuit 100 to read through all of the addresses of the RAMs 14 thru 16. This initial command may be issued through the JTAG controller 12, a scan chain input signal 62, or other means. A BIST test is separate and distinct from a diagnostic read.

When a RAM error is detected, the read RAM data is conveyed from the data register 54 external to the integrated circuit 10 to enable diagnosis of the data storage error external to the integrated circuit. The read data may be conveyed external to the integrated circuit by various means, including but not limited to, external pin 24 through the scan chain 20 embedded with the diagnostic read circuit or BIST circuit 100, directly to external pins Jx or DR pin 22, or internal/external integrated circuit buses.

As in the previous embodiment, along with the read data, the addresses used to address the RAMs can also be provided to external pins. The addresses may be provided directly to external pin 22 or through the scan chain 20 to the external pin 24, or other means such as internal/external integrated circuit buses.

The initial diagnostic read command may be invoked when a RAM is determined to have failed. This determination may be based upon parity errors which stop the integrated circuit from processing further data. This may even halt all operation of the integrated circuit. Hence, under such circumstances, RAM tests may be enabled at a leisurely pace by enabling the appropriate scan chains, JTAG controllers, or by generating specific control signals. In other instances where integrated circuit architectures provide continuous data flow, diagnostic read commands may be triggered immediately such as by the generation of the DR enable signals.

Although the RAM addresses may be provided to the external pins in response to a detected storage error, this may be unnecessary in some instances. For example, if the address sequences are already known by external diagnostic software, it may be possible to dispense with providing the memory addresses externally of the integrated circuit.

When invoking a diagnostic read through a scan chain, the address sequence must be preserved for subsequent reads to ensure complete reading of all bits in the RAM or RAMs. The process of scanning out data through a scan chain destroys the address sequence and all data stored in any registers, latches, or flip-flops. Reconfiguring these storage elements to a scan chain, then transferring data out serially will result in these storage elements being overridden by previous data in the same scan chain. The scan chain will have to be reloaded with the next sequence of addresses to be read from RAMs. An alternative approach is to transfer the diagnostic read data onto a nearby scan chain or JTAG chain while the BIST circuit is cycling through all RAM addresses and data bits.

I claim:

1. A diagnostic read circuit that presents random access memory data of an integrated circuit for external analysis, the diagnostic read circuit comprising:

an address generator that addresses and fetches the data stored in the random access memory; and a data register that temporarily stores the fetched data and that enables transfer of the data fetched from the random access memory for analysis external to the integrated circuit responsive to a control signal.

2. The circuit of claim 1 wherein the data register is coupled to at least one external pin of the integrated circuit.

3. The circuit of claim 2 further including a scan chain coupling the data register to the at least one external pin.

4. The circuit of claim 1 further including a sequence controller that receives the control signal and that causes the address generator to address the random access memory and the data register to store the random access memory data.

5. The circuit of claim 4 wherein the address generator provides random access memory addresses from the integrated circuit for the external analysis.

6. The circuit of claim 5 further including a scan chain coupled to an integrated circuit external pin and wherein the fetched data and the random access memory addresses are transferred through the scan chain to the external pin.

7. The circuit of claim 1 wherein the address generator and data register are within a built-in self-test circuit.

8. A diagnostic read circuit that presents random access memory data of an integrated circuit for analysis external to the integrated circuit, comprising:
an address generator that generates memory addresses of random access memory to obtain the data stored in the random access memory;
a data register for temporarily storing the obtained data;
a sequence controller that controls the address generator and the data register; and
at least one external pin carried by the integrated circuit and coupled to the data register that receives the obtained data from the data register.

9. The circuit of claim 8 further including a scan chain coupling the data register to the external pin.

10. The circuit of claim 8 wherein the address generator also provides the memory addresses to the at least one external pin.

11. The circuit of claim 10 further including a scan chain coupled to the at least one external pin and wherein the stored data and the memory addresses are transferred through the scan chain to the at least one external pin.

12. The circuit of claim 8 wherein the address generator and the data register are within a built-in self-test circuit.

13. An integrated circuits comprising:
a random access memory operable to store data at locations having respective addresses;
an external pin; and
a diagnostic circuit operable to couple the data from the memory to the external pin in response to an error in the data, the diagnostic circuit including,
an address generator operable to generate the addresses and to provide the addresses to the memory, and
a data register operable to receive the data from the addressed locations of the memory, to temporarily store the data, and to transfer the data to the external pin.

14. The integrated circuit of claim 13 further including a scan chain coupling the data register to the external pin.

15. The integrated circuit of claim 13 wherein the address generator provides the location addresses to the external pin.

16. The integrated circuit of claim 15 further including a scan chain coupled to the integrated circuit external pin and wherein the stored data and the location addresses are transferred through the scan chain to the external pin.

17. The integrated circuit of claim 13 further comprising:
a built-in self-test circuit; and
wherein the diagnostic circuit forms part of the built-in self-test circuit.

18. In an integrated circuit, a method comprising:
detecting a memory storage error in a random access memory;
generating addresses of locations of the random access memory with an address generator disposed on the integrated circuit in response to detecting the error;
reading data stored in the addressed locations of the random access memory;
temporarily storing the read data; and
transferring the temporarily stored read data to an external pin of the integrated circuit.

19. The method of claim 18 including the further step of transferring the location addresses to the external pin.

* * * * *